United States Patent [19]

Fawkes

[11] 4,428,008
[45] Jan. 24, 1984

[54] ELECTRONIC SWITCHING CIRCUIT FOR USE IN MAGNETIC HEAD DRIVES

[75] Inventor: John S. Fawkes, San Jose, Calif.

[73] Assignee: Ampex Corporation, Redwood City, Calif.

[21] Appl. No.: 364,692

[22] Filed: Apr. 2, 1982

[51] Int. Cl.³ .............................................. G11B 15/12
[52] U.S. Cl. ...................................... 360/61; 360/63; 360/68
[58] Field of Search ...................... 360/61, 63, 66, 67, 360/68

[56] References Cited

U.S. PATENT DOCUMENTS 4,203,139  5/1980  Horiuchi ............................. 360/61
4,266,254  5/1981  Hobrecht et al. ................... 360/61

*Primary Examiner*—Vincent P. Canney
*Attorney, Agent, or Firm*—J. D. Talcott; E. E. Strnad

[57] ABSTRACT

An electronic switching circuit coupled between a magnetic head driving circuit and transducing windings utilizing an electronic switch whose internal resistance changes substantially linearly in response to an increasing or decreasing control signal. Particularly useful in magnetic bias recording or erase circuits to eliminate erase of useful information and recording of disturbing noise spikes due to induced high frequency noise signal when the switch is activated.

13 Claims, 6 Drawing Figures

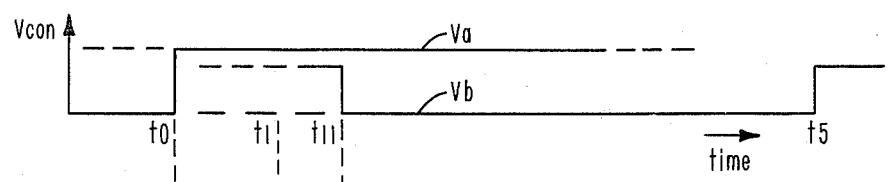
FIG_1A
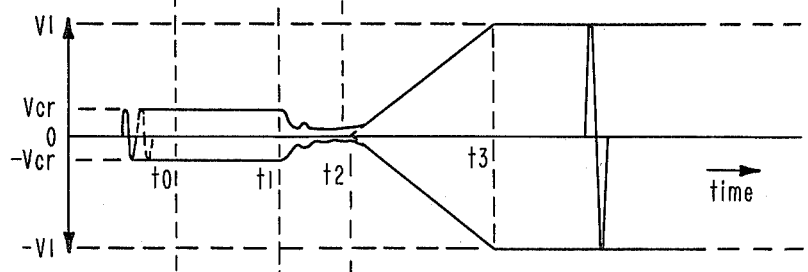
FIG_1B (PRIOR ART)
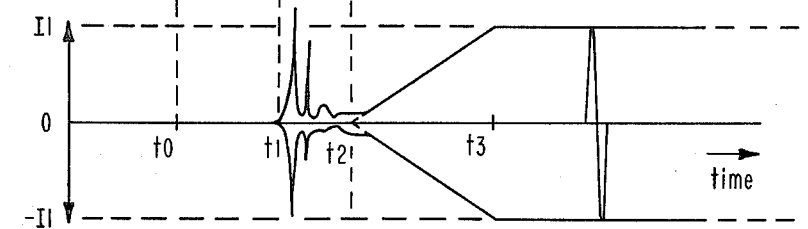
FIG_1C (PRIOR ART)
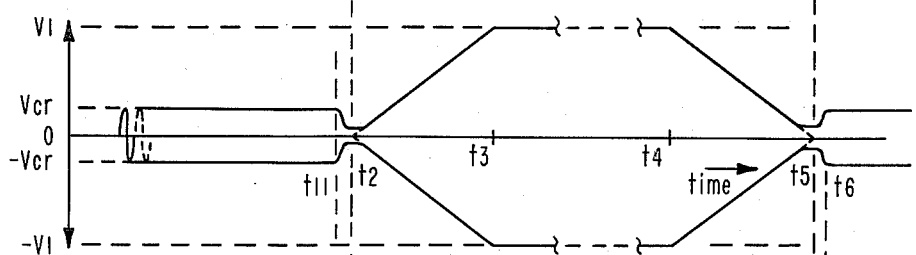
FIG_1D
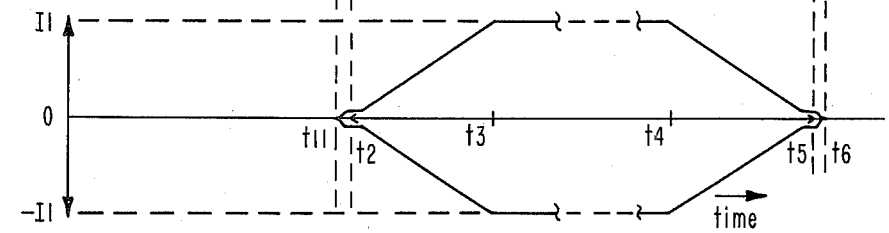
FIG_1E
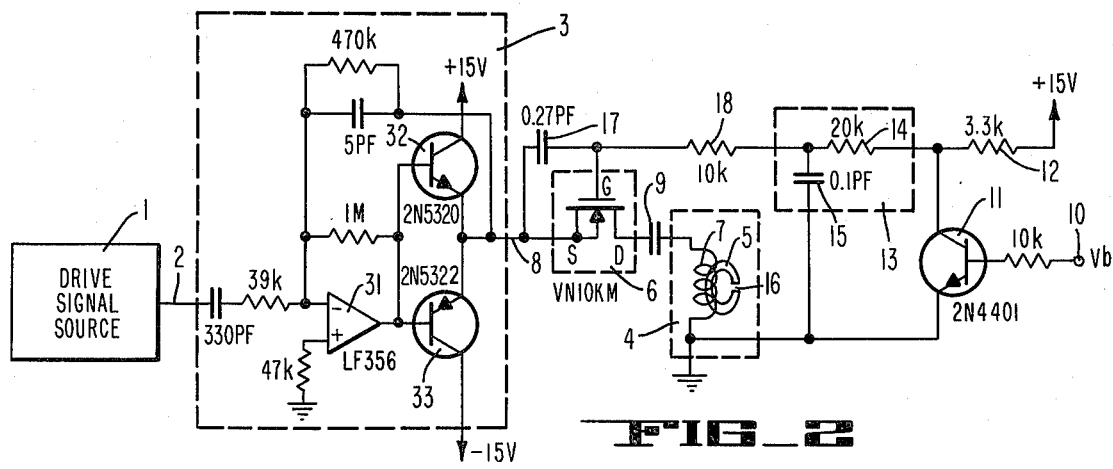
FIG_2

ELECTRONIC SWITCHING CIRCUIT FOR USE IN MAGNETIC HEAD DRIVES

BACKGROUND OF THE INVENTION

This invention relates to an electronic switching circuit for use in magnetic head drives and it is particularly useful in magnetic bias recording or erase circuits.

Prior art circuits for switching on and off currents applied to magnetic head windings such as for erase, bias or recording operations are known to utilize relay type electromechanical switches having machanical contacts connected between a head driving circuit and transducing windings. A control voltage is applied to the relay to control the switching. One such prior art circuit is employed for example for driving erase heads utilized in the audio portion of a video tape recorder, type VPR-2, manufactured by Ampex Corporation and described in VPR-2 Video Production Recorder, Catalog No. 1809384-02, page 10/9, issued in May 1980.

The above-mentioned type of switching circuit has significant disadvantages when utilized in transducer driving circuits where a high frequency noise signal is induced in the circuit. Every time when such switch is activated, sudden separation or connection of the mechanical contacts causes contact bounce and the noise potential which is present on the contacts effects considerable current spikes which enter into the transducing windings. For example, in multichannel recorders employing two or more adjacent recording channels high frequency crosstalk may be induced between the transducers of adjacent channels due to leakage flux originating from the transducing windings as well known in the art. If a first such transducer is for example in an erasing or recording mode a certain amount of crosstalk is induced from that transducer into the windings of a closely spaced second transducer. If thereafter the relay switch of the second transducer circuit is switched on by a control signal, as it is well known in the art, the crosstalk potential induced in the second transducer windings is shorted by the mechanical contacts of the switch thus effecting a current flow therein before the associated driving circuit is activated. Bouncing of the contacts follows accompanied by large spikes of current transient and ringing into the resonant circuit of the transducer, which undesirable oscillating current flows through the transducer windings. The above-indicated current causes unwanted erasure of existing information on the associated recording medium while recording thereon a sharp audible "pop" or "click" which is disturbing to the ear.

SUMMARY OF THE INVENTION

Accordingly, it is an object of the invention to provide a switching circuit for magnetic head drives which eliminates the above-indicated disadvantages of utilizing an electromechanical switch.

It is a further object of the invention to provide a switching circit for use in magnetic head drives employing an electronic switch having a substantially linearly changing resistance between a high resistance value corresponding to an open switch position and a low resistance value corresponding to a closed switch position.

It is a further object of this invention to provide a switching circuit having the above-indicated features and eliminating unwanted erasure of recorded signal as well as recording of undesirable noise spikes due to high frequency noise signal induced in the transducer windings when the switch is activated.

BRIEF DESCRIPTION OF THE DRAWINGS

FIG. 1A shows timing diagrams of respective D.C. voltages steps applied to activate switching circuits.

FIGS. 1B and 1C respectively show voltage and current characteristics of a prior art switching circuit.

FIGS. 1D and 1E show voltage and current characteristics of a circuit in accordance with a preferred embodiment of the invention as being compared to the characteristics of FIGS. 1B and 1C.

FIG. 2 shows circuit diagram of a preferred embodiment of the invention.

DETAILED DESCRIPTION

For better comparison and understanding of the operation of the invention and its advantages over the prior art, examples of prior art voltage and current characteristics with reference to FIGS. 1A to 1C will be now described.

FIG. 1A shows timing diagram Va of a D.C. control voltage Vcon applied at time t0 to a relay type prior art switch (not shown), causing closure of the respective switch contacts as it will be described below.

FIG. 1B shows an example of voltage characteristics of a prior art switching circuit (not shown) such as described in the above-indicated Catalog, having relay contacts connected between a source of erase signal and windings of a magnetic erase head, thereafter referred to as a first magnetic head or transducer. Let us suppose that a similar second erase transducer (not shown) located at a closely spaced adjacent channel is operating and thus it receives an optimum erase voltage, as it is well known in the art. A portion of the characteristics of FIG. 1B prior to time t1 represents an A.C. crosstalk voltage envelope Vcr, −Vcr, induced in the windings of the first head from the windings of the second head while the first head is not operating, that is when its respective relay contacts are open and consequently its windings are disconnected from the rest of the circuit. Typically the induced crosstalk voltage may obtain 30% of the optimum erase voltage level. Applying the control voltage Va shown in FIG. 1A at time t0 to the relay effects pulling together the respective relay contacts in time t1 in the circuit of the first transducer and thus shorting the existing crosstalk potential on these contacts. The portion of the characteristics of FIG. 1B between t0 and t1 represents a delay necessary for the relay to pull its contacts together, typically around 4 milliseconds, as it is well known in the art. The portion of the voltage characteristics of FIG. 1B between t1 and t2 shows "bumps" caused by contact bounce after the contacts are joined as mentioned earlier. The interval from t1 to t2 represents a time necessary for the voltage bumps to settle and to obtain a voltage envelope at time t2 having a nominal level close to zero. The latter interval is typically 2 milliseconds long.

FIG. 1C represents current characteristics corresponding to the voltage characteristics of FIG. 1B pertaining to the above-described prior art switching circuit (not shown). It is seen from FIG. 1C that prior to time t1 when the relay contacts of the first transducer circuit are joined together, no appreciable crosstalk current flows through the windings of that transducer. However, after the contacts are pulled together at t1, the shorted crosstalk potential Vcr, −Vcr shown in FIG. 1B causes unwanted crosstalk current to flow in the windings of the first erase head before the actual erase driving circuit is activated at time t2. The associated contact bounce modulates the high frequency current induced by the crosstalk in such a way that undesirable current spikes of substantial magnitude are provided in one direction and corresponding ringing current flows in the opposite direction into the associated resonant circuit of the erase transducer (not shown) as it is well known in the art and which portion of the characteristic is shown in FIG. 1C, between t1 and t2. The current spikes may reach a magnitude corresponding to that of the optimum erase current envelope I1, −I1 as shown in FIG. 1C. As a result an unwanted disturbing signal is recorded on the medium in the form of a sharp "pop" or "click", while a signal which may have been previously recorded on that portion of the medium is now erased by that noise signal.

Time t2 in FIGS. 1B and 1C indicates end of the above-described interval and the beginning of a linearly increasing high frequency erase voltage and current envelope, commonly referred to as a "ramp-up" voltage and current respectively, applied to the transducer windings by associated driving circuits (not shown) in a manner well known in the art and for example described in the above-indicated Catalog. At time t3 the optimum voltage and current envelope values ±V1 and ±I1 are respectively reached and thereafter maintained by the prior art circuit at a constant value as it is shown in FIGS. 1B and 1C and as it is known in the art.

It will be understood that transient voltage and current characteristics similar to those shown between t1 and t2 in FIGS. 1B and 1C may occur as a result of a sudden cessation of crosstalk current flow between the relay contacts when a control voltage such as shown at Va in FIG. 1A is suddenly removed from the prior art relay windings thus causing the contacts to separate. The latter is generally provided after the optimum voltage and current values ±V1; ±I1 are "ramped-down" virtually to zero, as it is known in the art.

FIGS. 1D and 1E show respective voltage and current characteristics pertaining to the circuit of the preferred embodiment of the invention shown in FIG. 2, which characteristics are compared below to the previously described prior art characteristics of FIGS. 1B and 1C, respectively.

An example of a timing diagram Vb depicting a control voltage Vcon applied in time t11 to a control circuit of an electronic switch utilized in the preferred embodiment of the invention is shown in FIG. 1A.

FIG. 1D is an example of an erase voltage envelope and FIG. 1E is an example of a corresponding erase current envelope provided by the preferred embodiment of the invention. It is seen from FIGS. 1D and 1E that the voltage bumps and current spikes shown in FIGS. 1B and 1C due to contact bounce and ringing are respectively removed from the characteristics of FIGS. 1D and 1E. It is also seen from FIGS. 1D and 1E that substantially linearly changing crosstalk voltage and current characteristics are obtained when comparing to the corresponding prior art characteristics and that the delay in the switching operation such as shown between t0 and t1 of FIGS. 1B, 1C is eliminated.

Now the circuit of the preferred embodiment shown in FIG. 2 and the operation thereof with reference to FIGS. 1D and 1E will be described. A source of high frequency driving signal 1 is connected via line 2 to a voltage amplifier 3, as it is well known in the art of magnetic bias or saturating recording or erasing and is for example described in the above-indicated Catalog. The voltage amplifier 3 in the preferred embodiment is implemented by a well known combination of an inverting operational amplifier 31, having a pair of complementary power transistors 32, 33 coupled to its output and having an overall negative feedback loop coupled from the output 8 of amplifier 3 to its input 2. The driving signal which in the preferred embodiment is represented by an erase voltage has a frequency for example of 80 kHz as it is known to be utilized in magnetic audio recorders. A magnetic transducer 4 is schematically shown as having a magnetic core 5 with opposite poles forming a transducing gap 16 and a conductive transducer coil 7 is wound around the core as it is well known in the art. In accordance with the invention, an electronic switch 6 is utilized in the switching circuit of FIG. 2 which does not have mechanical contacts. Switch 6 is preferably implemented by a power FET transistor, such as VMOS which is coupled between the voltage amplifier 3 and coil 7 as follows.

The source terminal S of FET transistor 6 is connected to the output of amplifier 3 via line 8, while its drain terminal D is connected via a capacitor 9 to the transducer coil 7. Capacitor 9 and coil 7 together form an LC resonant circuit of the erase head 4, as it is known in the art. The gate terminal G of FET transistor 6 is indirectly controlled by a control voltage Vb shown in FIG. 1A which is received on line 10 in the form of a low going or negative D.C. step voltage from a suitable source such as a TTL gate (not shown) or alternatively, it may be generated by a microprocessor logic system (not shown).

The control voltage Vb on line 10 is applied to the gate G of FET switch 6 via a control circuit as it will be described below. An inverting transistor switch 11 has its base coupled to line 10, its emitter grounded and its collector connected to a +15 V D.C. voltage supply via a resistor 12. An RC ramping circuit 13, also referred to as passive integrating circuit, has a series resistor 14 connected at one end to the collector of transistor 11 and at its other end via a further resistor 18 to the gate of FET transistor 6. The capacitor 15 of the ramping circuit 13 is connected between the junction of resistors 14, 18 and ground. A further capacitor 17 is connected between the gate G and source S of FET transistor 6 and it represents a so-called "bootstrap" capacitor as it will follow from further description. It is emphasized herein that the above-described source-to-drain orientation of the FET transistor switch 6 within the circuit is provided to obtain an extremely low transconductance and thus an extremely high internal resistance of the switch for example in the order of several hundred thousand ohms to several tens of megaohms corresponding to an effective "off" state, in which there is a negligible current flow between the source S and drain D. On the other hand an extremely high transconductance corresponding to an extremely low internal resistance in the order of several ohms is obtained, respectively, between the latter electrodes S, D, corresponding to an effective "on" state of the switch.

Now the operation of the circuit of FIG. 2 will be described in more detail. To activate switch 6, the control terminal 10 receives the low going D.C. step voltage Vb as it is shown at t11 in FIG. 1A, for example of 3.4 V, thus introducing virtual ground at the base of transistor 11. Consequently a corresponding high-going voltage step from the +15 V D.C. source is applied via resistors 14 and 18 to the gate of FET transistor 6. Resistor 18 is selected to have a relatively large resistance value preferably between 10 to 100 kiloohm to effectively separate the high frequency circuit of the gate of the FET transistor 6 from the D.C. ramp circuit 13.

The "bootstrap" capacitor 17 is connected between the gate G and source S of FET transistor 6 as well known to obtain an A.C. short therebetween thus reducing distortion of the output signal from the FET switch during the switching transitions. With respect to the relatively large ohmic resistance of resistor 18 the ramping circuit 13 does not receive the high frequency erase current on line 8. Upon receiving the above-mentioned high going control voltage step (not shown) at the collector of transistor 11 at time t11, the ramping circuit 13 provides a substantially linearly increasing control voltage or ramp (not shown) and applies it via resistor 18 to the gate G of FET switch 6. As it is known from the characteristics of the type of FET transistor utilized the source-to-drain voltage of transistor 6 substantially linearly follows the control voltage change. Preferably the voltage amplifier 3 is selected to have a very low output impedance, such as several ohms so that the source terminal of FET transistor 6 is connected to an impedance as low as possible for proper operation of switch 6.

FIG. 1D depicts the voltage characteristics between the source and drain of FET transistor 6. When comparing the voltage characteristics of FIG. 1D to those of FIG. 1B described previously, it is seen that a high frequency crosstalk voltage envelope level Vcr, −Vcr is substantially linearly decreasing virtually instantly upon applying control voltage Vb at time t11. The interval t11 to t2 is determined by the time constant RC of the respective resistor 14 and capacitor 15 values of the ramping circuit 13 which time constant in the preferred embodiment it is selected 0.5 milliseconds.

Current characteristics corresponding to the voltage characteristics of FIG. 1D of switch 6 are shown in FIG. 1E. It is seen that the crosstalk current envelope prior to time t11 has a virtually zero magnitude and it is followed by a substantially linearly increasing ramp corresponding to the above-described substantially linearly decreasing voltage envelope of FIG. 1E from t11 to t2. It follows from the above-description that the switch circuit of FIG. 2 substantially linearly ramps both the crosstalk voltage and current envelopes in response to a control voltage step Vb applied on line 10. As a result there is no disturbing "click" or "pop" recorded on the tape due to induced crosstalk. It will be understood from the above description that an analogous operation of the circuit of FIG. 2 is obtained when a high-going control voltage step Vb is applied on line 10, as it is shown at t5 in FIG. 1A. After the erase voltage envelope has been ramped-down from the optimum value V1, −V1 to almost zero it is desired to interrupt the erase current driving circuit, as it is known in the art. Consequently, upon receiving the voltage step on line 10 at t5 the RC circuit 13 will provide a substantially linearly increasing crosstalk voltage envelope or ramp envelope as it is seen between t5 and t6 in FIG. 1D, accompanied by a corresponding linearly decreasing crosstalk current envelope or ramp shown in FIG. 1E. The respective voltage and current ramps are provided within an interval t5 to t6 corresponding to the previously described interval t1 to t2, which in the preferred embodiment is selected as 0.5 milliseconds.

From the foregoing disclosure it follows that by utilizing the switching circuit of the invention an induced high frequency noise signal may be substantially resistively ramped in a first direction from a very high resistance value such as in the other of 10 megaohm in the open state to a very low resistance value such as in the order of 10 ohms in closed state of the switch or in a second, opposite direction, depending on the direction of the D.C. control signal.

It is noted herein that the above-described type of FET switch is utilized in the preferred embodiment with respect to its substantially linear region of current and voltage characteristics which may be ramped in the region of its pinch-off voltage.

It is a particular advantage of the switching circuit of the invention that the above-mentioned low resistance value in the closed state does not interfere with that is, it does not dampen the LC resonant circuit of the transducer shown in FIG. 2.

It is a further advantage that a desired time constant which determines the duration of the ramp that is, the transition interval between t11 and t2 as well as between t5 and t6 is determined by the respective values of resistor 14 and capacitor 15 of the control circuit 13. Consequently, by selecting the latter values the necessary transition period may be reduced to minimum as described previously. It is seen from the foregoing description that the circuit of the invention significantly shortens switching delays and also it provides substantial power savings when comparing to the prior art relay type switches utilized in magnetic transducer drives.

While the preferred embodiment of the invention has been described with respect to an electronic switching circuit utilized in magnetic signal erasing circuits, it will be understood by those skilled in the art that it may be utilized with minor changes in signal recording circuits as well. In the latter case instead of source 1 for example a high frequency bias recording or saturation recording signal source may be utilized and the erase transducer 4 may be replaced by a suitable recording transducer as it is well known in the art. In some applications the resonant capacitor 9 of FIG. 2 may be replaced by a nonresonant capacitor or alternatively, it may be deleted entirely from the circuit thus providing D.C. coupling if the D.C. offset at the output 8 of driving amplifier 3 can be kept sufficiently low.

While the invention has been shown and described with particular reference to a preferred embodiment thereof, it will be understood that variations and modifications in form and details may be made therein without departing from the spirit and scope of the invention as defined in the appended claims.

What is claimed is:

1. A circuit for switching a driving current applied to a magnetic transducer, comprising:
a magnetic transducer having a magnetic core with poles forming a transducing gap and transducing windings wound around said magnetic core;
a driving signal source coupled to supply said driving current to said transducing windings; and
an electronic switching means having an input coupled to said output of said driving signal source, having an output coupled to said transducing windings and having a control input coupled to receive a substantially linearly changing D.C. control signal in a first or second direction, respectively, said switching means having an internal resistance value which changes substantially linearly in response to said D.C. control signal changing in a first direction from a high resistance value corresponding to an open state of said switching means when said driving current is disconnected from the transducing windings to a low resistance value corresponding to a closed state of said switching means when said driving current is connected to the transducing windings and conversely, said internal resistance value of said switching means changes substantially linearly in response to said D.C. control signal changing in a second direction from said low resistance value to said high resistance value, respectively.

2. The circuit of claim 1 further comprising:
a control means having an input coupled to receive a D.C. voltage step, said control means having an output coupled to provide said substantially linearly changing D.C. control signal in said first or second direction in response to a first or second value of said D.C. voltage step respectively, and wherein said output of said control means is coupled to said control input of said electronic switching means.

3. The circuit of claim 2 wherein said electronic switching means comprises a field effect transistor means having a source terminal coupled to said output of said driving signal source, a drain terminal coupled to an input of said transducing windings and a gate terminal coupled to said output of said control means.

4. The circuit of claim 3 wherein said control means is coupled to receive said D.C. voltage step as a high or low going step and wherein said control means comprises a voltage ramping means coupled to provide said substantially linearly changing D.C. control signal in said first or second direction in response to one said voltage step.

5. The circuit of claim 4 wherein said ramping means comprises a first resistor coupled between said input of the control means and said gate terminal of the field-effect transistor means and a first capacitor having one terminal coupled between said first resistor and said gate terminal and a second terminal of said first capacitor being grounded, said first resistor and first capacitor having selected values providing a time constant corresponding to duration of said linearly changing D.C. control signal and wherein a second resistor is coupled between the gate terminal of said field effect transistor and a junction of said first resistor with said first capacitor, respectively to separate said control means from said driving current.

6. The circuit of claim 5 further comprising a second capacitor coupled between said source and gate terminals of said field effect transistor, respectively.

7. A circuit for switching a driving current applied to a magnetic transducer, comprising:
a magnetic transducer having a magnetic core with poles forming a transducing gap and transducing windings wound around said magnetic core;
a driving signal source coupled to supply said driving current to said transducing windings;
an electronic switching means having an input coupled to an output of said driving signal source and having an output coupled to said transducing windings and having a control input coupled to receive a control signal;
a control means having an input coupled to receive a positive or negative going D.C. voltage step and having an output coupled to provide a substantially linearly changing output voltage in a first or second, opposite direction in response to one said D.C. voltage step voltage, said output of the control means being coupled to said control input of said electronic switching means; and
said electronic switching means having an internal resistance value which changes substantially linearly from a high resistance value corresponding to an open state of said switching means to a low resistance value corresponding to a closed state of said switching means in response to said substantially linearly changing output voltage provided by the control means in said first direction and which internal resistance value changes substantially linearly from said low to said high resistance value in response to said substantially linearly changing output voltage provided by the control means in said second, opposite direction, respectively.

8. A circuit for switching a driving current applied to a magnetic transducer, comprising:
a magnetic transducer having a magnetic core with poles forming a transducing gap and transducing windings wound around said magnetic core;
a driving signal source coupled to supply said driving current to said transducing windings;
a field-effect transistor means having a source terminal coupled to an output of said driving signal source, a drain terminal coupled to said transducing windings and having a gate terminal;
a voltage ramping means having an input coupled to receive a high or low D.C. voltage step and having an output coupled to provide in response thereto a substantially linearly increasing or decreasing output voltage, respectively, said output of said voltage ramping means being coupled to said gate terminal of the field-effect transistor means; and
said field-effect transistor means providing an internal resistance value which changes substantially linearly from a high resistance value corresponding to an open circuit between said source and drain electrode to a low resistance value corresponding to a closed circuit between said last mentioned electrodes in response to one of said increasing or decreasing output voltage and said internal resistance value changes substantially linearly from said low to said high resistance value, respectively, in response to the other one of said increasing or decreasing output voltage.

9. The circuit of claim 8 wherein said voltage ramping means comprises a first resistor and a first capacitor, one terminal of the first resistor representing said input is coupled to receive said D.C. voltage step and its other terminal representing said output is coupled to one terminal of the first capacitor whose second terminal is grounded.

10. The circuit of claim 9 further comprising a second resistor coupled between a junction of said first resistor with said first capacitor and said gate terminal of said field-effect transistor to separate the respective circuit portions from each-other for preventing a high frequency signal from said driving signal source to flow into said voltage ramping means.

11. The circuit of claim 10 further comprising a second capacitor coupled between said source and gate terminals of said field-effect transistor to provide an A.C. signal short therebetween.

12. A circuit for switching a driving current applied to a magnetic transducer, comprising:
   a magnetic transducer having a magnetic core with poles forming a transducing gap and transducing windings wound around said magnetic core;
   a driving signal source coupled to supply said driving current to said transducing windings;
   a field-effect transistor means having a source terminal coupled to an output of said driving signal source, a drain terminal coupled to said transducing windings and having a gate terminal;
   a first resistor and a first capacitor each having one terminal interconnected, said first resistor having a second terminal coupled to receive a D.C. voltage step, a second terminal of said first capacitor being grounded;
   a second resistor coupled between said interconnected terminals and said gate terminal of the field-effect transistor; and
   a second capacitor coupled between said gate and source terminals of said field-effect transistor.

13. The circuit of claim 12 further comprising a transistor switch having a base coupled to receive a D.C. voltage step, having an emitter grounded and having a collector coupled to a D.C. power supply and to said second terminal of said first resistor, respectively, said collector being coupled to provide an inverted D.C. voltage step and apply the same to said second terminal of the first resistor in response to said D.C. voltage step received by said transistor base.

* * * * *